United States Patent [19]
Chen et al.

[11] Patent Number: 6,121,114
[45] Date of Patent: Sep. 19, 2000

[54] METHOD FOR PREPARING A DUMMY WAFER

[75] Inventors: Weng-Yi Chen, Chupei; Kuen-Chu Chen, Hsinchu Hsien, both of Taiwan

[73] Assignee: United Integrated Circuits Corp., Shinchu, Taiwan

[21] Appl. No.: 09/205,866

[22] Filed: Dec. 4, 1998

[30] Foreign Application Priority Data

Aug. 18, 1998 [TW] Taiwan ................................. 87113552

[51] Int. Cl.⁷ ..................................................... H01L 21/76

[52] U.S. Cl. ......................... 438/433; 438/225; 438/297; 438/362; 438/439

[58] Field of Search .................................... 438/225, 297, 438/362, 439, 433

[56] References Cited

U.S. PATENT DOCUMENTS

| | | | |
|---|---|---|---|
| 5,910,018 | 6/1999 | Jang | 438/443 |
| 6,027,970 | 2/2000 | Sharan et al. | 438/255 |
| 6,033,969 | 3/2000 | Yoo et al. | 438/443 |
| 6,046,083 | 4/2000 | Lin et al. | 438/255 |

*Primary Examiner*—Charles Bowers
*Assistant Examiner*—David S Blum
*Attorney, Agent, or Firm*—Jiawei Huang; J. C. Patents

[57] ABSTRACT

The method of the invention starts with forming a mask on a blank wafer, wherein the mask contains a number of openings that expose a portion of the wafer. By performing a wet oxidation process, field oxide is formed on the exposed surface of the wafer. The wafer surface is then become ragged after the mask and the field oxide are removed. In order to further increase the surface area of a dummy wafer, an etching process is performed on the ragged surface after a hemispherical grained layer is formed on the ragged surface.

10 Claims, 3 Drawing Sheets

METHOD FOR PREPARING A DUMMY WAFER

CROSS-REFERENCE TO RELATED APPLICATION

This application claims the priority benefit of Taiwan application serial no. 87113552, filed Aug. 18, 1998, the full disclosure of which is incorporated herein by reference.

BACKGROUND OF THE INVENTION

1. Field of the Invention

This invention relates to a method for preparing a dummy wafer, and more particularly, to a method for preparing a dummy wafer used in a chemical vapor deposition (CVD) process.

2. Description of Related Art

Chemical vapor deposition (CVD) is a common process used for forming a semiconductor thin film device that is theoretically based on controlling the reaction of gasiform reactant occurring with in a reacting furnace or tube. Generally, a CVD system basically consists of a reactor, gas-pumping system, an exhaust system, and a process control system.

For a tubular-type low-pressure chemical vapor deposition (LPCVD) system shown in FIG. 1, the most commonly used batch-type CVD system, the system contains a hot-wall reactor 10 made of annealed quartz. The reactor 10 is further surrounded by a three-zone heater 12 used for heating the reactor 10. While a LPCVD process is performed, the gasiform reactant is pumped into the reactor 10 from a door 14, and a boat 20 that carries a number of wafers 18 is then transported into the reactor 10 and placed at a pre-determined position. The exhaust gas of the LPCVD process is released by an exhaust system through a releasing end 16.

The boat 20 further contains a wafer stage for holding a certain number of wafers 18. When a CVD process is proceeded, it is required that the wafer stage is fully loaded in order to ensure the uniformity of the thickness of deposited materials. In case that a insufficient number of wafers 18 are placed on the wafer stage of the boat 20, the vacancies on the wafer stage need to be occupied with dummy wafers to ensure the uniformity of deposition.

Conventionally, black wafers are usually placed on the wafer stage of a CVD system to serve as dummy wafers while a CVD process is performed. Since the profile of a dummy wafer, which has a smooth surface, is very different from what of a productive wafer that has an accidented surface constructed by devices formed on the wafer, the amount of consumed reactant deposited on a dummy wafer is different from what of a productive wafer. Therefore, loading effect, that is, the thickness of material deposited on the surface of wafers is not uniform, occurs. The loading effect is more distinct when a CVD process of silicon nitride layer is performed.

SUMMARY OF THE INVENTION

It is therefore an objective of the present invention to provide a method for preparing a dummy wafer to prevent the occurrence of loading effect.

It is another an objective of the present invention to provide a method for preparing a dummy wafer to ensure that a uniform thickness of deposited material can be obtained on the surfaces of wafers.

In accordance with the foregoing and other objectives of the present invention, the method of the invention processes the smooth surface of a dummy wafer into a grained surface in order to increase the surface area, hence, to reduce the difference between a productive wafer and a dummy wafer.

The method of the invention starts with forming a mask on a blank wafer, wherein the mask contains a number of openings that expose a portion of the wafer. By performing a wet oxidation process, field oxide is formed on the exposed surface of the wafer. The wafer surface is then become ragged after the mask and the field oxide are removed. In order to further increase the surface area of a dummy wafer, an etching process is performed on the ragged surface after a hemispherical grained layer is formed on the ragged surface.

The material deposited on the dummy wafer can be removed by performing an etching process, therefore, the dummy wafer of the invention is reusable. For example, a silicon nitride layer formed on the dummy wafer can be removed by performing an etching process with hydrofluoric acid (HF) as an etchant.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for preparing a dummy wafer used in a chemical vapor deposition system, as shown in FIGS. 2A through 2E. The processed dummy wafer contains a ragged grained surface, which has larger surface area than a planar smooth surface.

Figure 2A:
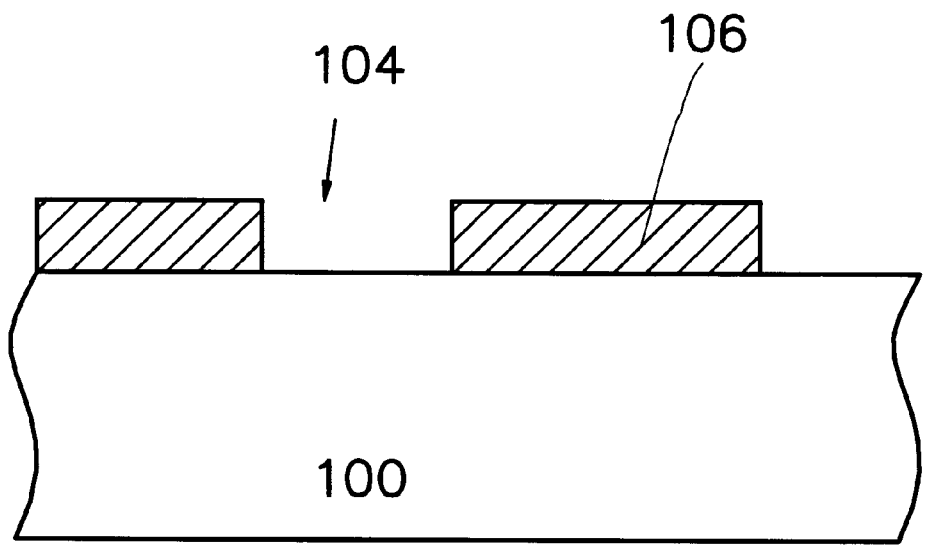
FIGS. 2A through 2E are schematic cross-sectional views showing the method for preparing a dummy wafer of a preferred embodiment according to the invention.

Referring to FIG. 2A, a pad oxide layer (not shown in figure) is formed on a provided substrate 100, such as a semiconductor substrate, by performing a process like thermal oxidation. A patterned mask 102, such as silicon nitride, is formed on the pad oxide layer over the substrate 100, wherein the mask contains opening 104 exposing the structure underneath.

Figure 2B:
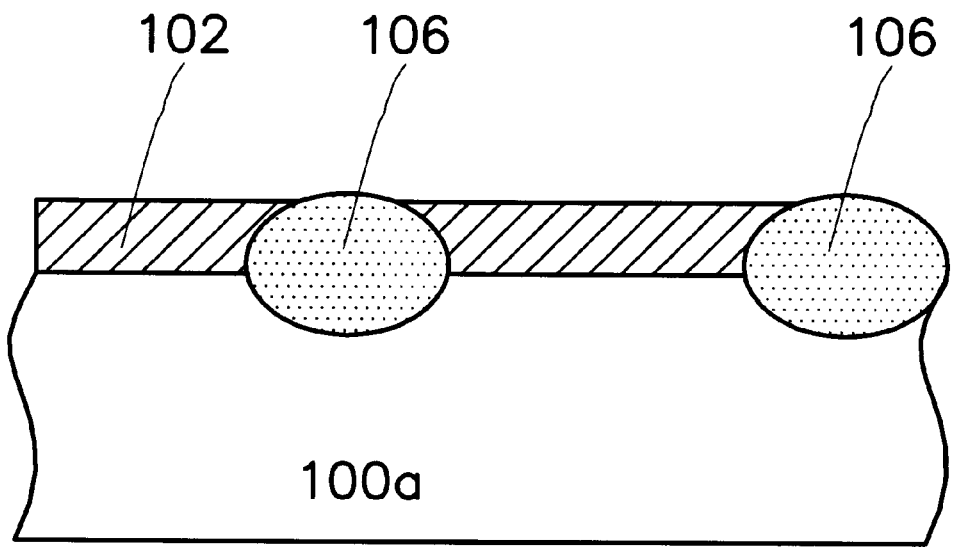

Referring next to FIG. 2B, a field oxide layer 106 is formed on the exposed region over the substrate. The field oxide layer 106 can be formed by performing a wet oxidation process, or other oxidation processes capable of achieving the same goal. Since the oxidation process is performed on the surface of the wafer 100 with the substrate 100, for example, a silicon substrate, as a reactant, part of substrate 100 is consumed by the oxidation reaction and oxidized into oxide of a certain thickness according to the reaction period. The remains of the substrate 100 now are turned into a substrate 100a that has a number of dished regions beneath the field oxide layer 106.

Figure 2C:
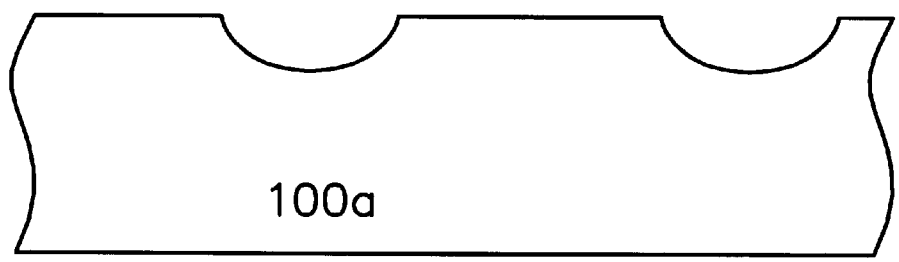

Referring to FIG. 2C, the mask layer 102 and the field oxide layer 106 are removed by performing a process like wet etching to expose the surface of the substrate 100a, wherein the etchant used in a wet etching process can be hydrofluoric (HF) acid of a concentration of about 40% to 60%. Because part of the substrate 100a contains dished regions formed by the oxidation process, the total surface area of the substrate 100a is larger than the total surface area of the original substrate 100.

Figure 2D:
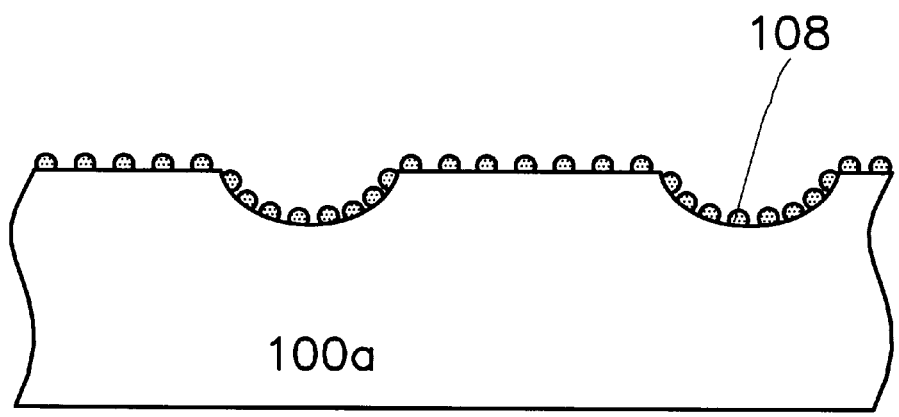

Referring next to FIG. 2D, in order to further increase the total surface area of the substrate 100a, a hemispherical grained polysilicon (HSG-Si) layer 108 is formed on the substrate 100a. The method of forming the HSG-Si layer 108 can be a low-temperature chemical vapor deposition process at a pre-determined reaction temperature with $SiH_4$ or $Si_2H_6$ as a reactant. The pre-determined reaction temperature is between the generation temperatures of amorphous silicon and polysilicon. Other processes under proper conditions can be used to form the HSG-Si layer 108 as well.

Figure 2E:
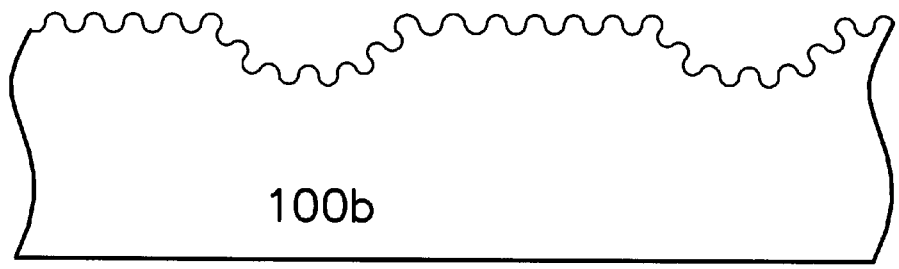

Referring to FIG. 2E, an etching process is performed on the substrate 100a to enhance the junction between the substrate 100a and the HSG-Si layer for remaining the roughness of the surface of the substrate 100a. The surface area of the enhanced dummy wafer 100b is about 2 to 4 times over the surface area of a conventional dummy wafer.

Since the surface area of the dummy wafer according to the invention can be roughly determined by the thickness of the field oxide layer 106, it can be made to be close to the surface area of a productive wafer to prevent the occurrence of loading effect by controlling the oxidation time.

Figure 1:
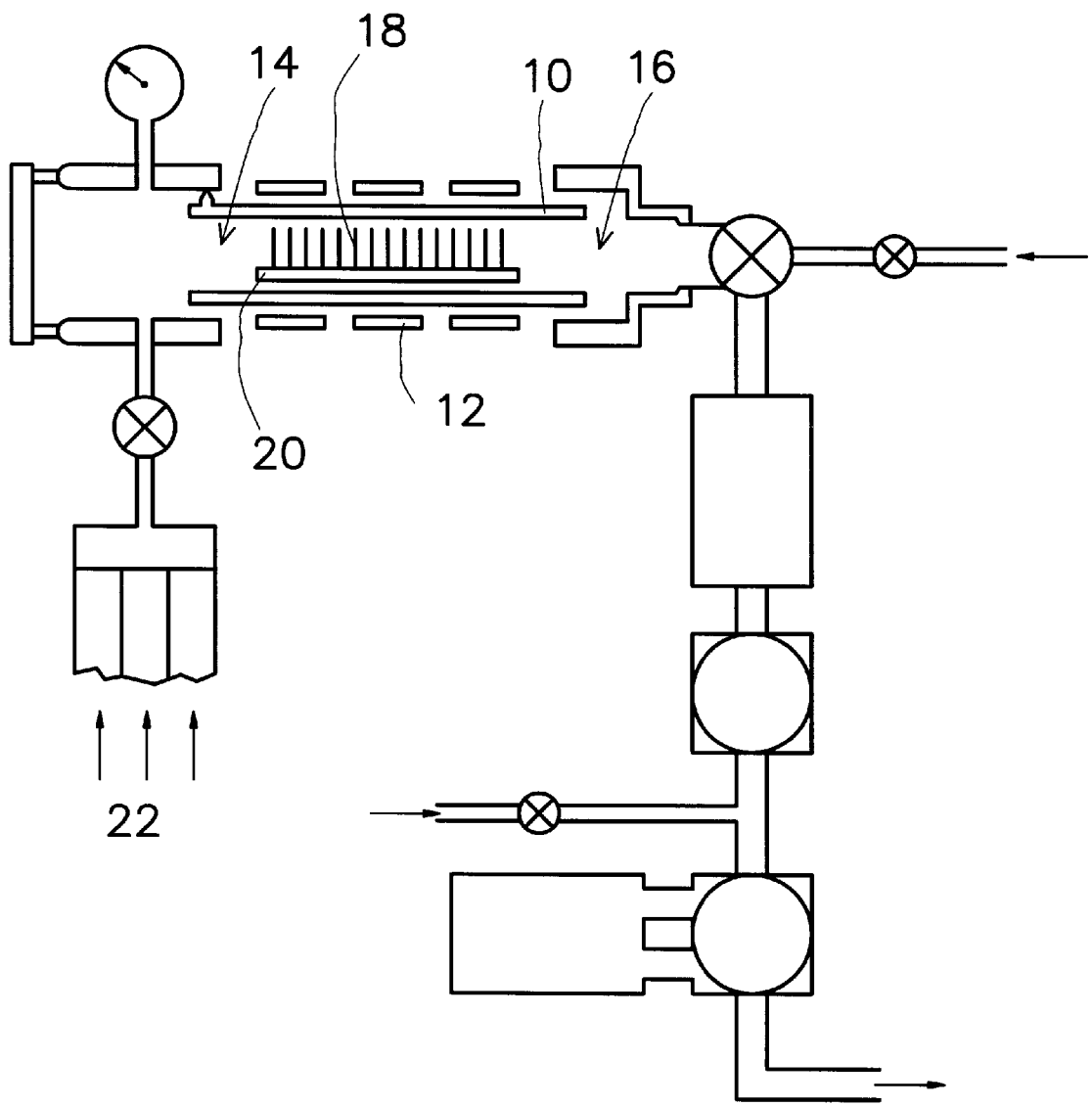
FIG. 1 is a schematic diagram illustrating a tubular-type low-pressure chemical vapor deposition reactor.

The surface area of a dummy wafer of the invention is controlled by the thickness of the field oxide layer, that is, the oxidation time. Hence, by properly controlling the oxidation time, the surface area of a dummy wafer is made close to the surface area of a productive wafer. Therefore, by occupying the vacancies on the wafer stage of a boat 20 shown in FIG. 1 with the dummy wafers of the invention, the thickness of deposited film formed by a CVD process, especially a silicon nitride layer formed by a LPCVD process, can be more uniform.

The deposited material on the dummy wafer of the invention can be removed by applying solution of hydrofluoric acid without damaging the surface of the dummy wafer, wherein the concentration of the solution is about 40% to 60%. So, the dummy wafer of the invention is reusable.

In accordance with the foregoing, it is a specificity of the invention to obtain a dummy wafer containing a larger surface area through simple semiconductor fabrication processes. The surface area of the dummy wafer according to the invention is about 2 to 4 times over the surface area of a convention dummy wafer.

It is another specificity of the invention to simulate the surface area of a dummy wafer by controlling the thickness of the field oxide layer, that is, controlling the oxidation reaction time, to prevent the occurrence of loading effect.

It is also a specificity of the invention that the dummy wafer can be reused by simply applying solution of hydrofluoric acid to remove the deposited materials such as a LPCVD silicon nitride film, wherein the concentration of the solution is about 40% to 60%.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for preparing a dummy wafer, comprising:

providing a substrate;

forming a mask on the substrate, wherein the mask contains a plurality of openings exposing a portion of the substrate;

forming a field oxide layer on the substrate not covered by the openings, and removing the mask and the field oxide layer to expose the substrate to roughen the substrate.

2. The method of claim 1, wherein the mask includes silicon nitride.

3. The method of claim 1, wherein the step of forming a field oxide layer includes wet oxidation.

4. The method of claim 1, wherein the step of removing the mask and the field oxide layer includes using a hydrofluoric acid solution of a concentration as an etchant.

5. The method of claim 4, wherein the concentration of the hydrofluoric acid solution is about 40% to 60%.

6. A method for preparing a dummy wafer, comprising:

providing a substrate;

forming a mask on the substrate, wherein the mask contains a plurality of openings exposing a portion of the substrate;

forming a field oxide layer on the exposed portion of the substrate;

removing the mask and the field oxide layer to expose the substrate;

forming a hemispherical grained polysilicon layer on the substrate; and forming an etching process to roughen the substrate.

7. The method of claim 6, wherein the mask includes silicon nitride.

8. The method of claim 6, wherein the step of forming a field oxide layer includes wet oxidation.

9. The method of claim 6, wherein the step of removing the mask and the field oxide layer includes using a hydrofluoric acid solution of a concentration as an etchant.

10. The method of claim 9, wherein the concentration of the hydrofluoric acid solution is about 40% to 60%.

* * * * *